United States Patent

Matsuo et al.

[11] Patent Number: 5,307,568
[45] Date of Patent: May 3, 1994

[54] GAS SUPPLY SYSTEM

[75] Inventors: Takenobu Matsuo; Tsuyoshi Wakabayashi, Kofu; Shjui Moriya, Yamanashi, all of Japan

[73] Assignee: Tokyo Electron Limited, Tokyo, Japan

[21] Appl. No.: 942,501

[22] Filed: Sep. 9, 1992

[30] Foreign Application Priority Data

Sep. 9, 1991 [JP] Japan .................. 3-258576
Sep. 9, 1991 [JP] Japan .................. 3-258577
Sep. 9, 1991 [JP] Japan .................. 3-258578
Sep. 11, 1991 [JP] Japan .................. 3-259743

[51] Int. Cl.$^5$ .............................. F26B 13/30
[52] U.S. Cl. .............................. 34/92; 34/402
[58] Field of Search ............ 34/15, 92, 82, 5

[56] References Cited

U.S. PATENT DOCUMENTS 5,035,065  7/1991  Parkinson .................. 34/92

*Primary Examiner*—Denise Gromada
*Attorney, Agent, or Firm*—Oblon, Spivak, McClelland, Maier & Neustadt

[57] ABSTRACT

A gas supply system includes a gas source containing a process gas to be supplied in a reduced-pressure container, a piping unit including a metallic pipe through which the process gas circulates and arranged between the gas supply source and the reduced-pressure container, and a duct formed of a metallic and/or nonmetallic pipe and arranged between the piping unit and the reduced-pressure container. At least part of the duct is formed of an austenitic stainless steel containing 6% or more of molybdenum by weight.

10 Claims, 12 Drawing Sheets

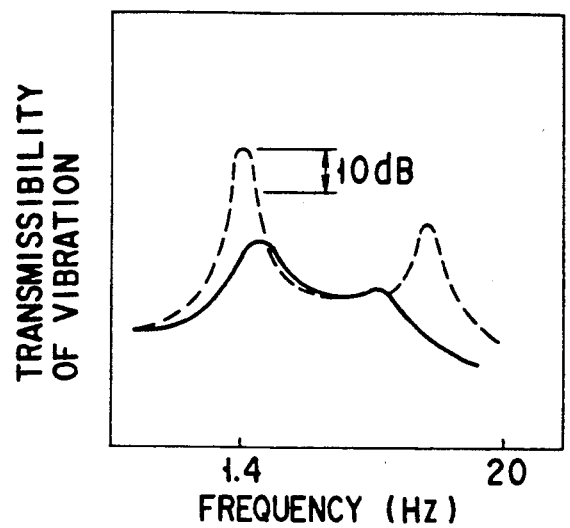
F I G. 9
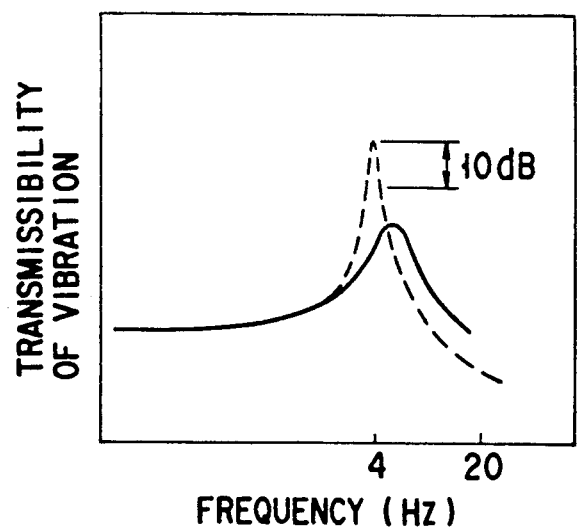
F I G. 10

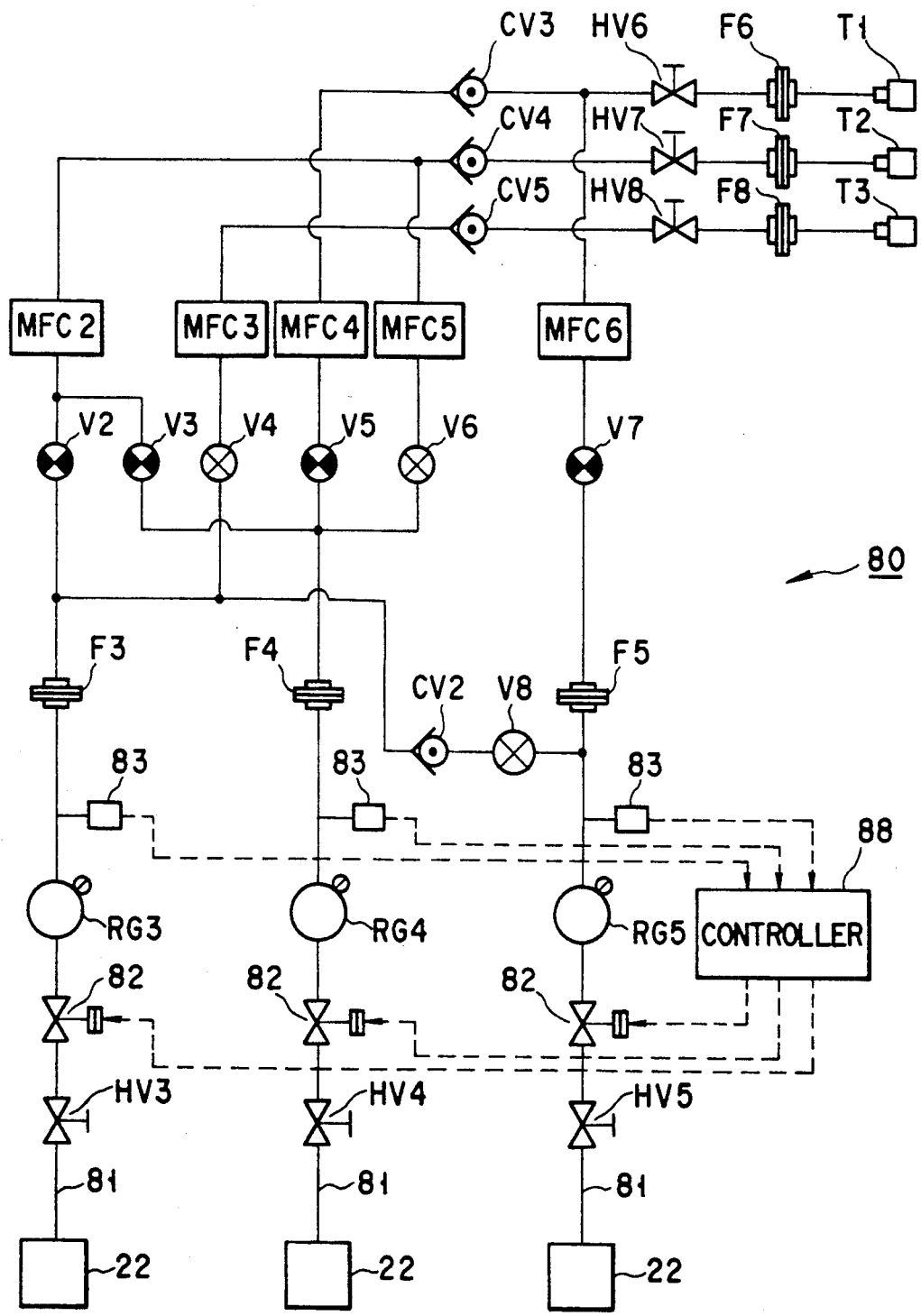
F I G. 11

GAS SUPPLY SYSTEM

BACKGROUND OF THE INVENTION

1. Field of the Invention

The present invention relates to a gas supply system used in an apparatus for heat-treating semiconductor wafers under reduced pressure, and more particularly, to a gas supply system for a reduced-pressure CVD apparatus.

2. Description of the Related Art

With the improvement of the packing density and performance of modern semiconductor devices, micro-contamination has increased its influences upon the yield, quality, and reliability of the products. The micro-contamination is a trouble, such as a pattern defect caused by adhering particles or deterioration of electrical properties attributable to inclusion of heavy metal ions on the atomic or molecular level, which may cause defects in products. In order to eliminate such micro-contamination, it is necessary to prevent particles or heavy metal ions from being produced in a transportation system, treatment system, etc., included in a series of manufacturing stages for semiconductor devices, thereby totally cleaning the plant.

Since chlorine system gas, dichlorosilane gas, or some other highly corrosive gas flows as a process gas in a gas supply system of a reduced-pressure CVD apparatus, for example, a material with a high corrosion resistance is used for a gas piping. A conventional gas piping is formed of JISSUS316L, an austenitic stainless steel.

When the reduced-pressure CVD apparatus is stopped, however, nonreactive residual gas is sucked into the gas piping as the inside of a process tube is restored from the decompressed state to the atmospheric-pressure state, so that the piping is corroded by the gas. In particular, bend portions and welded joints of the piping are seriously corroded, and the resulting corrosion products form particles The welded joints of the piping produce heavy metal ions in no small quantities. If these contaminants get into the process tube and adhere to semiconductor wafers, the micro-contamination is caused.

As the memory capacity of DRAMs increases to 16M or 32M or further to 64M, the devices tend to have patterns with a submicron-order stroke width. In manufacturing these semiconductor devices with very fine patterns, micro-contamination is caused if only a small quantity of particles or heavy metal ions get into the process tube. In other words, a negligible quantity of particles or heavy metal ions for the manufacture of 4M-capacity DRAMs is a significant quantity for the manufacture of DRAMs of 16M or larger capacity. Since the conventional gas piping, formed of JIS-SUS316L, is not designed for the manufacture of the DRAMs of 16M or larger capacity, the quantity of particles or heavy metal ions produced at the welded joints of the pipe line cannot be ignored.

In a conventional gas supply system, as shown in FIG. 1, gas filters 7 are attached to a piping 3, and are used to remove particles in a gas supply source (not shown). A base frame 4 has a vertical panel portions 5 on each end thereof, and a piping connecting portion 3a is attached to the panel portion 5. A valve 8 and a mass-flow controller (MFC) 9 are arranged individually on pedestals 6.

The gas filters 7 are lightweight devices which each have a filter portion, formed of a stainless-steel mesh, therein. Thus, the filters 7 are removably connected to the piping 3, and are supported by means of the piping 3 only.

In a clean room which houses the gas supply system, mechanical vibrations of an air conditioner, exhaust pump, etc. are propagated to the system. Thereupon, the vibrations are propagated to the gas piping 3. If the vibration frequency agrees with the natural resonance frequency of the piping 3 or gas filters 7, a high resonance is brought about, so that the filters 7 undergo a substantial vibration. Recently, there has been an increasing demand for compact-design systems. Further, there is a proposal that a gas feeding system and an exhaust system of a heat treatment apparatus should be integrated into a unit. In this case, the piping 3 of the gas supply system inevitably has a complicated three-dimensional configuration, so that it cannot be easily fixed, and its vibration presumably becomes stronger. Accordingly, some of the particles once seized by the gas filters 7 are released by the vibration, and get into the process tube.

In general, the internal space of a semiconductor device manufacturing plant is divided in two, a clean room and a maintenance room. A semiconductor wafer transportation system and the like are installed in the clean room, and a gas feeding system and an exhaust system in the maintenance room. Since filming or etching semiconductor wafers requires use of a highly hazardous gas, combustible or toxic, a gas cylinder is located outside the plant building.

Since the gas sealed in the gas cylinder is under a very high pressure, the gas pressure is generally reduced to about 50 $kg/cm^2$ by means of a pressure regulator which is connected directly to the cylinder. The gas pressure is also reduced by means of a pressure regulator which is attached to the piping, and the gas is fed into the process tube of the CVD apparatus via the valve the mass-flow controller, etc. In forming a polysilicon film by the reduced-pressure CVD method, for example, the pressure and flow rate of the process gas are adjusted to 2 to 3 $kg/cm^2$ and several hundreds to several thousands of SCCM, respectively.

Since the number of processes is increased in the modern semiconductor manufacturing method, the whole system is expected to be reduced in size. Also for the gas supply system, there is a proposal to integrate the gas filters and valves into a unit, in order to ensure a compact design, easy maintenance, and general-purpose properties of the system.

Since the treatment processes are diverse, on the other hand, the gas piping 3 of the gas supply system has many branches, and many piping accessories are arranged for each branch. If the piping accessory unit is constructed in the aforesaid manner, therefore, the piping in the unit is long, and the piping accessories are increased in number.

As a safety measure for handling the hazardous gas, in the conventional semiconductor device manufacturing plant, however, large-sized, large-capacity gas filters and valves, which can stand high pressure, are used for the conventional gas supply system. For example, pressure valves which can stand a pressure much higher than 100 $kg/cm^2$ are used for the purpose. Thus, the piping unit is increased in size and weight.

SUMMARY OF THE INVENTION

An object of the present invention is to provide a gas supply system in which particles of corrosive products and heavy metal ions cannot be easily produced at welded joints or bend portions of piping.

Another object of the invention is to provide a gas supply system capable of preventing particles, once trapped by a gas filter, from being released therefrom lest the particles are discharged to the lower-course side of the filter.

Still another object of the invention is to provide a gas supply system capable of preventing seized particles from being released from a gas filter due to vibration, and of preventing joint portions of piping from loosening.

According to an aspect of the present invention, there is provided a gas supply system comprising a gas supply source containing a process gas to be used for treatment in a reduced-pressure container; a piping unit including a metallic pipe through which the process gas circulates and arranged between the gas supply source and the reduced-pressure container; and a duct formed of a metallic or nonmetallic pipe and arranged between the piping unit and the reduced-pressure container, at least part of the metallic pipe being formed of an austenitic stainless steel containing 6% or more of molybdenum by weight.

Preferably, the metallic pipe is formed of an austenitic stainless steel containing 6.0 to 6.5% of molybdenum, 17.5 to 18.5% of nickel, and 19.5 to 20.5% of chromium, all by weight, along with at least copper and nitrogen.

The piping unit is provided with various other components than the metallic pipe, including a gas filter, mass-flow meter, check valve, pressure regulator, etc. Among these components, the gas filter should preferably be fixed to a unit panel. If this is done, the gas filter cannot be situated in the position corresponding to the maximum amplitude of the standing-wave vibration of the metallic pipe, so that the vibration of the gas filter can be damped. Thus, particles once seized are not released from the filter, so that clean gas can be fed into a process tube.

Preferably, moreover, the principal part of the piping unit should be supported by means of a vibration damping member. The vibration damping member includes an elastic body, such as rubber, which attenuates vibration propagated through the metallic pipe.

The process gas from the gas supply source is introduced into a heat treatment apparatus through a gas piping and control devices, such as the valves, mass-flow meter, etc. If the process gas is a corrosive gas, the inner surface of a gas passage, especially a welded joint thereon, which touches the gas, will be corroded microscopically. However, this corrosion can be greatly retarded by forming the whole gas piping from the austenitic stainless steel containing 6% or more of molybdenum by weight, for example. Thus, production of particles and heavy metal ions at the gas passage portion can be minimized, so that even those objects of treatment whose tolerance for contaminants is rather small can be protected against bad influences of the particles and heavy metal ions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9 shows a characteristic curve representing the transmissibility characteristic of horizontal vibration of the vibration damping member;

FIG. 10 shows a characteristic curve representing the transmissiblity characteristic of vertical vibration of the vibration damping member;

FIG. 11 is a circuit diagram showing an outline of a gas supply system according to a second embodiment of the invention;

DETAILED DESCRIPTION OF THE PREFERRED EMBODIMENTS

Gas supply systems according to various embodiments of the present invention, which are applied to a vertical type reduced-pressure CVD apparatus, will now be described in detail with reference to the accompanying drawings.

Figure 2:
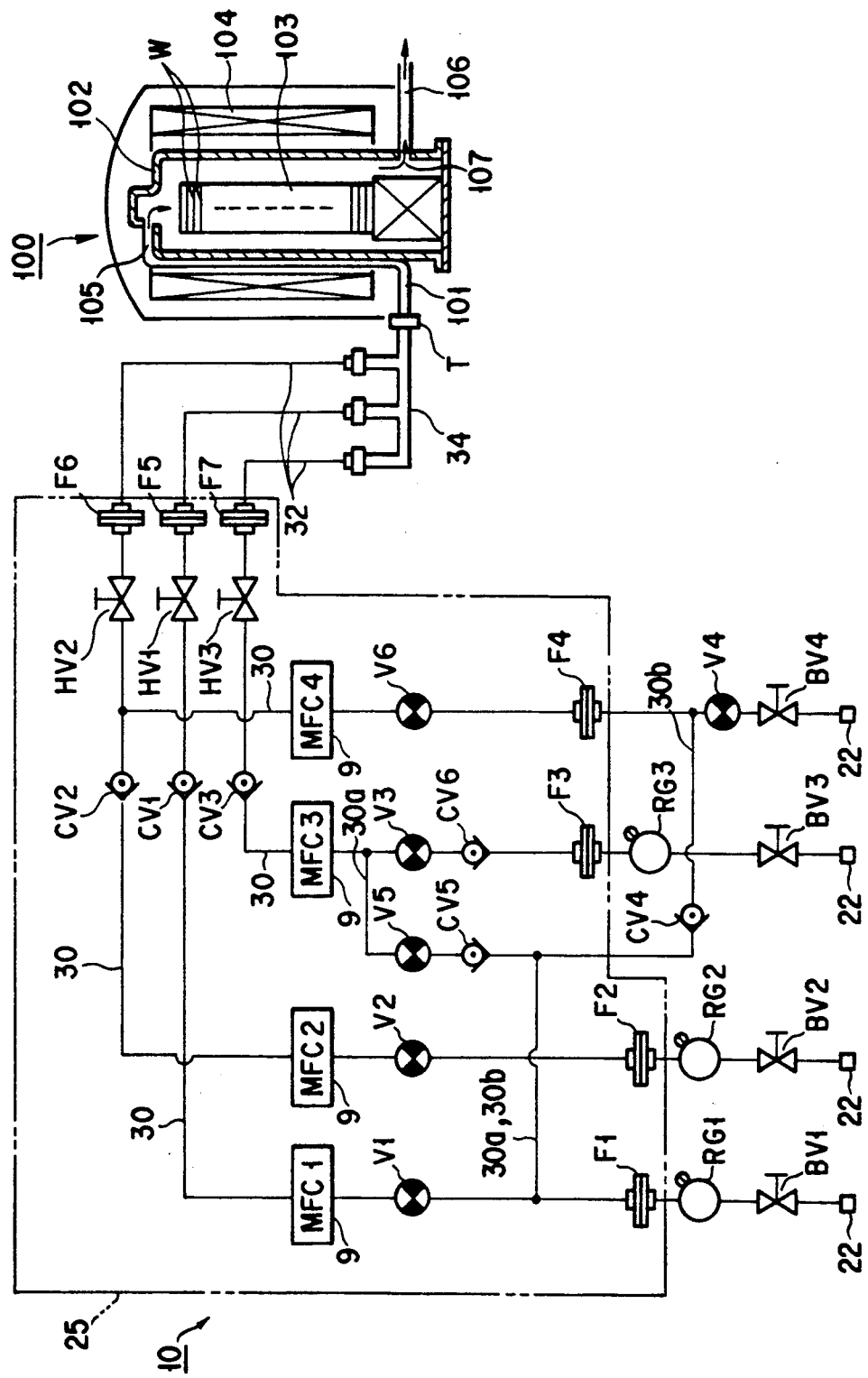
FIG. 2 is a circuit diagram showing an outline of a gas supply system according to a first embodiment of the present invention.

As shown in FIG. 2, a process tube 102 of a vertical CVD apparatus 100 is loaded with a wafer boat 103 so that a number of semiconductor wafers W can be collectively heated by means of a heater 104. A centralized piping 34 of a gas supply system 10 is connected to a manifold 101 by means of a joint T. The manifold 101 communicates with a gas inlet 105 at the upper portion of the process tube 102. An gas outlet 107, which is formed at the lower portion of the tube 102, communicates with a vacuum pump 24 by means of an exhaust pipe 106.

The gas supply system 10 comprises a piping unit 25 which includes a panel and various components mounted thereon. The piping unit 25 communicates with four gas supply sources 22 and three lower-course lines 32. The three lower-course lines 32 converge into the centralized piping 34. Each gas supply source 22 includes a high-pressure gas cylinder loaded with dichlorosilane gas, $CCl_4$ gas, $CF_4$ gas, $CClF_3$ gas, $CCl_2F_2$ gas, $CBrF_2$ gas, or $BCl_3$ gas. First to fourth lines 30 are connected to the respective inlet ports of the gas cylinders, individually.

The first line 30 is provided with a ball valve BV1, pressure regulator RG1, gas filter F1, valve V1, mass-flow controller MFC1, check valve CV1, hand valve HV1, and gas filter F5. The second line 30 is provided with a ball valve BV2, pressure regulator RG2, gas filter F2, valve V2, mass-flow controller MFC2, check valve CV2, hand valve HV2, and gas filter F6. The third line 30 is provided with a ball valve BV3, pressure regulator RG3, gas filter F3, check valve CV6, valve V3, mass-flow controller MFC3, check valve CV3, hand valve HV3, and gas filter F7. The fourth line 30 is provided with a ball valve BV4, valve V4, gas filter F4, valve V6, valve V4, and mass-flow controller MFC4. The lower-course side of the fourth line 30 joins the second line 30 in the unit 25. A by-pass circuit 30a is arranged between the first and third lines 30. The circuit 30a is provided with a check valve CV5 and a valve V5, and one end of the circuit 30a communicates with that portion of the third line 30 just on the upper-course side of the controller MFC3. Another by-pass circuit 30b is arranged between the first and fourth lines 30. The circuit 30b is provided with a check valve CV4, and one end of the circuit 30b communicates with that portion of the fourth line 30 just on the upper-course side of the gas filter F4.

Figure 3:
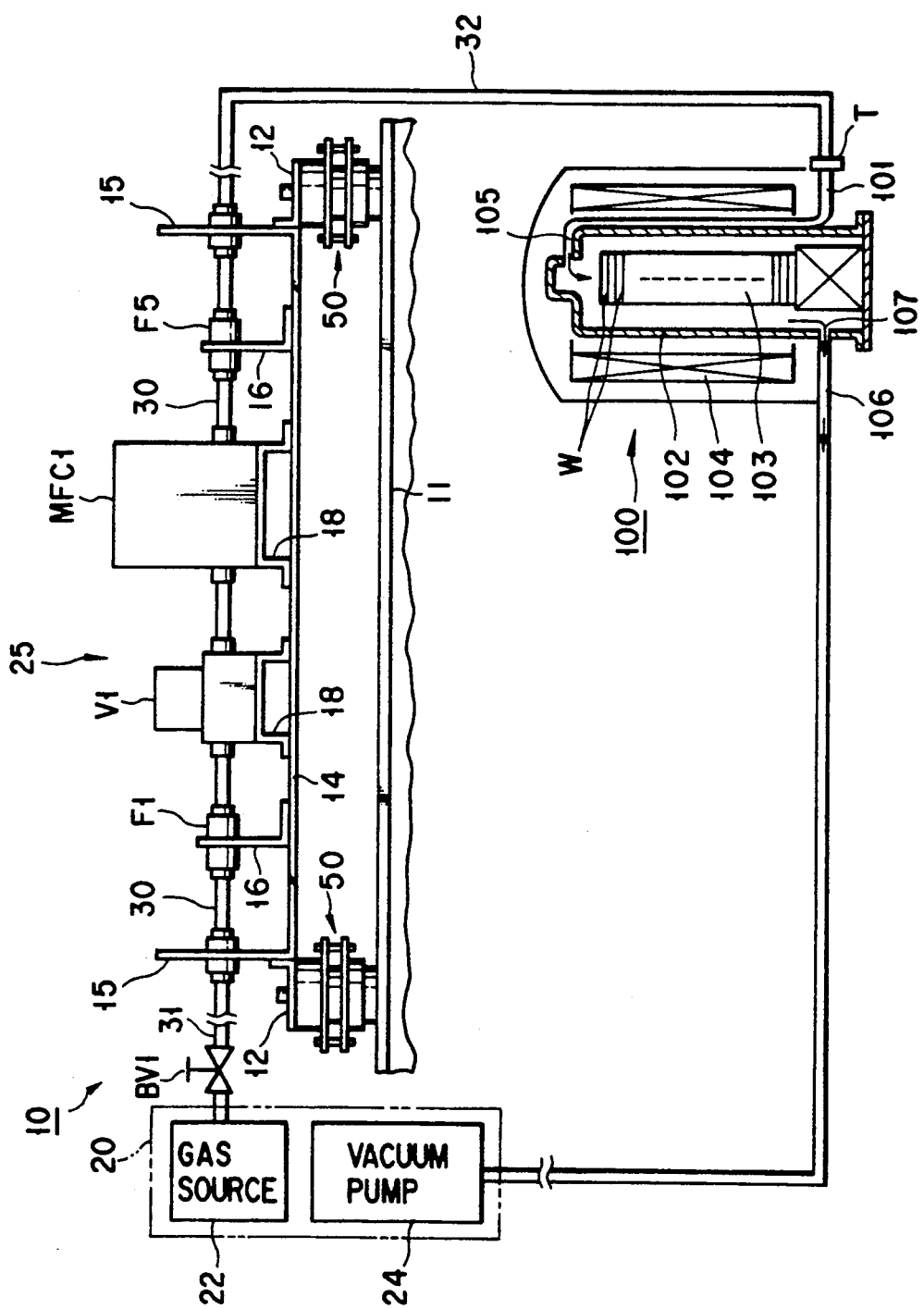
FIG. 3 is a schematic view showing the gas supply system of the first embodiment.
Figure 5:
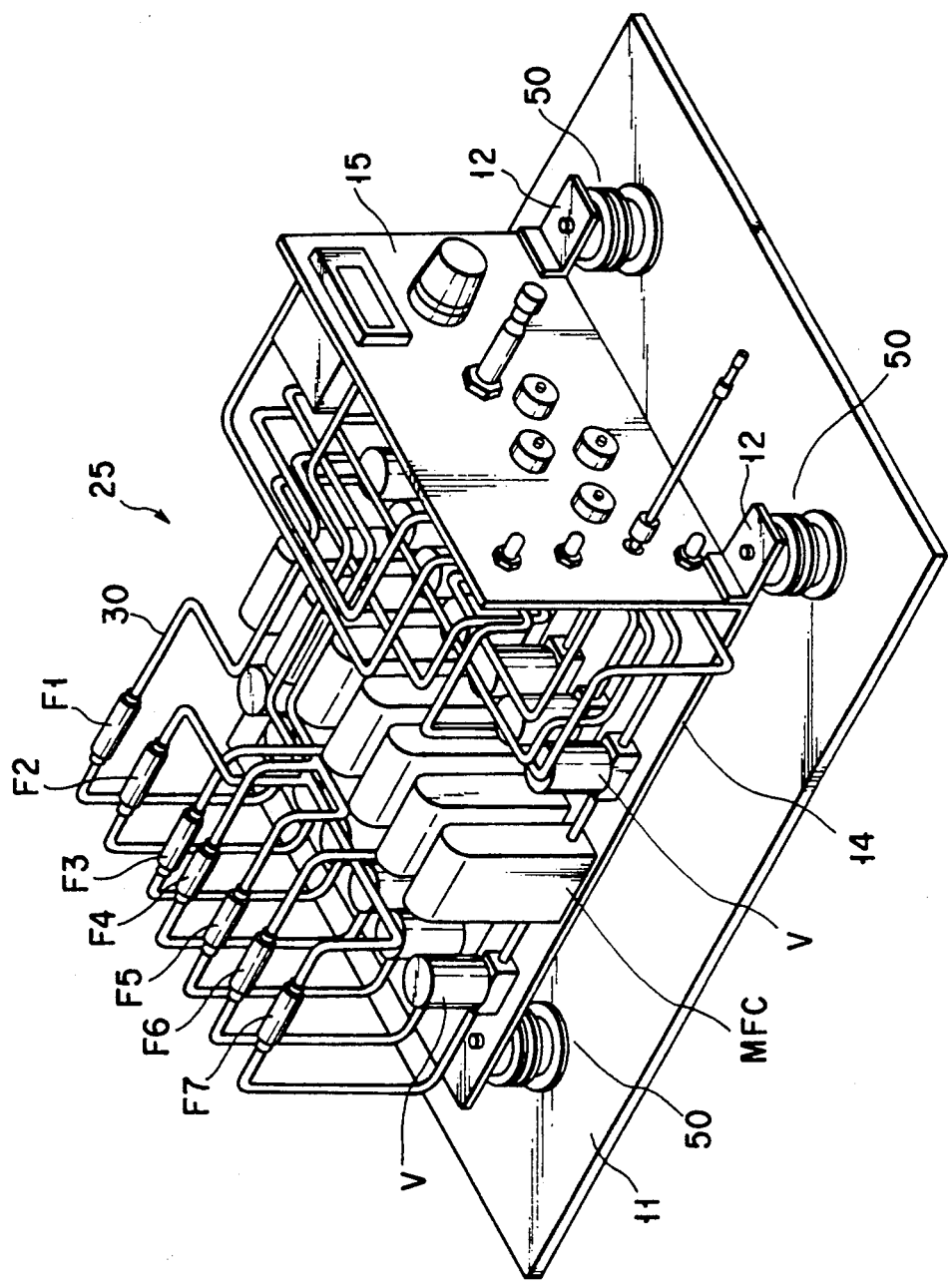
FIG. 5 is a perspective view showing a piping unit of the gas supply system.
Figure 7:
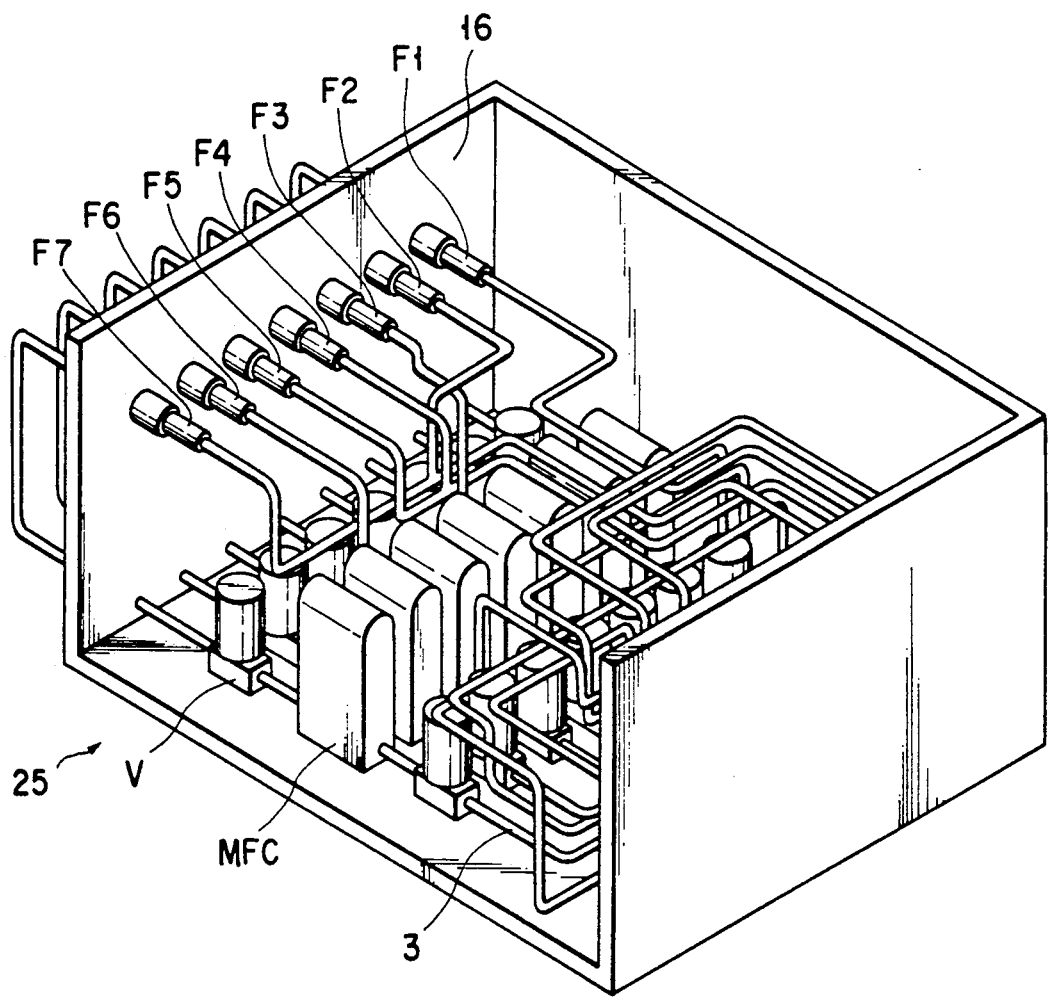
FIG. 7 is a perspective view showing the piping unit of the gas supply system.

Referring now to FIGS. 3, 5 and 7, the piping unit 25 will be described. For simplicity, only the first piping system will be described, and a description of the other piping systems will be omitted.

The individual components of the piping unit 25 ar fixed on the panel 14, which is supported on a base frame 11 by means of four vibration damping members 50. The panel 14 is formed by bending both sides of a stainless-steel plate, and a pair of pipe joint members 19 are attached individually to vertical panel portions 15 on the opposite sides of the panel 14. The piping 30, which extends between the two joint members 19, is connected with the gas filter F1, valve V1, controller MFC1, and gas filter F5 in the order named. The valve V1 and the controller MFC1, which are heavyweight components, are fixed to the floor of the panel 14 by means of their corresponding pedestals 18. On the other hand, the gas filters F1 and F5, which are lightweight components, are fixed to the panel floor by means of their corresponding angle supports 16.

Figure 4:
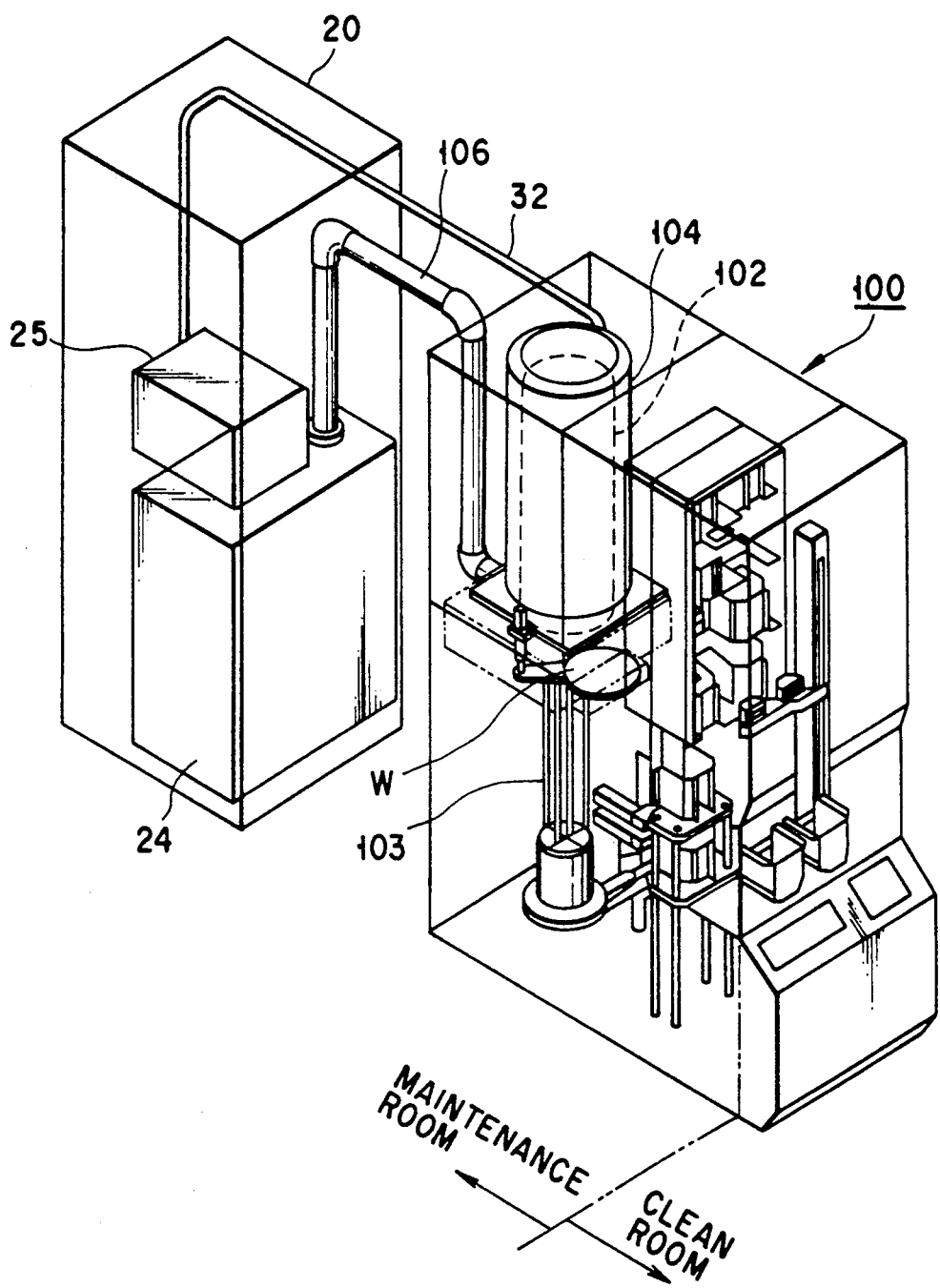
FIG. 4 is a perspective view showing an outline of the gas supply system of the first embodiment and a vertical CVD apparatus.

As shown in FIG. 4, the piping unit 25, along with the vacuum pump 24, is located in the housing of a gas apparatus 20. The gas apparatus 20 and the CVD apparatus 100 are arranged in a maintenance room. A wafer loading/unloading apparatus adjoins the CVD apparatus 100, and its control panel portion is located in a clean room. The piping unit 25 communicates with the gas cylinders (not shown) which are arranged outside the plant buildings.

Figure 6:
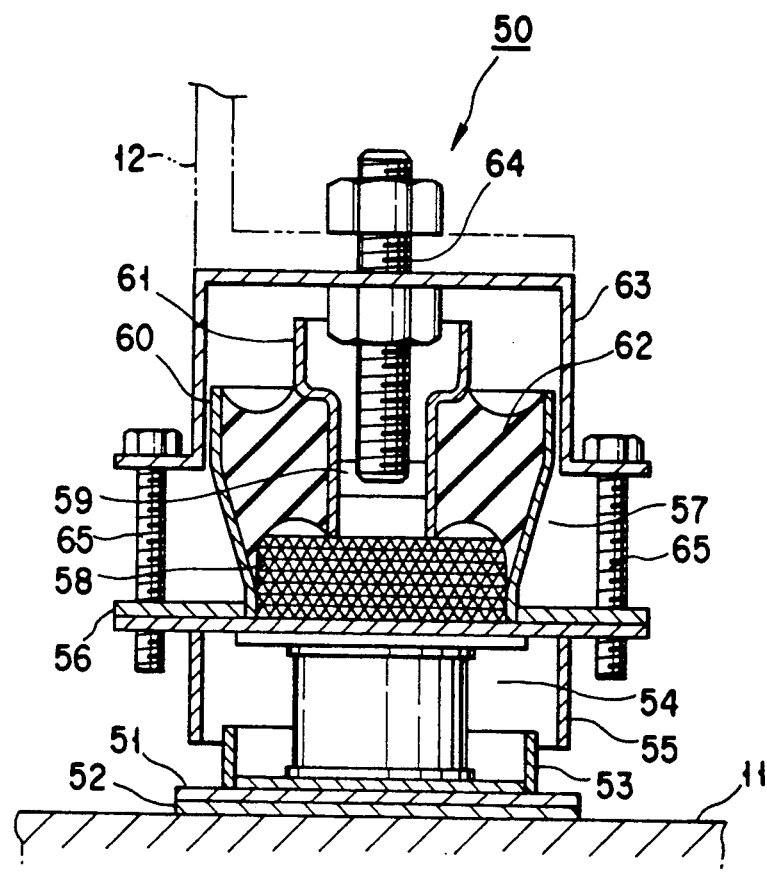
FIG. 6 is a longitudinal sectional view showing a vibration damping assembly for the piping unit.

Referring now to FIG. 6, one of the vibration damping assembly 50 of the piping unit 25 will be described.

The vibration damping assembly 50 is arranged between the base frame 11 and a panel fixture 12. A base portion 51 of the assembly 50 is formed of a nonskid pad 52 and a plate 53 bonded together. The nonskid pad 52 is made of self-adhesive rubber. A cylindrical first stopper 53 is disposed on the base portion 51 so as to surround a horizontal vibration removing portion 54. A second stopper 55, having a diameter greater than that of the first stopper 53, is attached to the underside of an intermediate plate portion 56 so as to be coaxial with the first stopper 53. The first and second stoppers 53 and 55 serve to restrict the horizontal vibration of the intermediate plate portion 56.

The horizontal vibration removing portion 54, which is formed of a cylindrical laminated structure of rubber, serves to restrain a horizontal vibration, among other vibrations propagated from the base frame 11.

The upper part of vertical vibration removing a portion 57 is situated inside a cover portion 63 with a suitable space between them. The end of the portion 57 is fixed to the upper surface of the intermediate plate portion 56. A damper 58 is disposed at the bottom of the vertical vibration removing portion 57. The damper 58 is a laminated structure -formed of a plurality of corrugated boards. A rubber vibration insulator 62 is disposed on the damper 58. It is held between outer and inner cylinders 60 and 61.

The upper cover 63 is fixedly connected to the panel fixture 12 and the intermediate plate portion 56 by means of a major bolt 64 and minor bolts 65, respectively.

The following is a description of the lines 30, 32 and 34 for process gas supply.

Pipes of the lines 30, 32 and 34 are made from a special austenitic stainless steel (hereinafter referred to as stainless steel A) which contains 6.0% of molybdenum by weight. As shown in Table 1, stainless steel A contains 0.020% or less of carbon, 1.00% or less of manganese, 0.25% or less of phosphorus, 0.01% or less of sulfur, 0.5 to 1.0% of copper, 17.5 to 18.5% of nickel, 19.5 to 20.5% of chromium, 6.0 to 6.5% of molybdenum, and 0.18 to 0.22% of nitrogen, all by weight, along with iron and inevitable impurities for the remainder. The following is a description of the individual components of the stainless steel A.

Since carbon produces a chromium carbide which lowers the corrosion resistance of the steel, its content should be as low as possible. If the carbon content is 0.020% or less by weight, there is no problem of corrosion at welded joints, practically.

Since silicon, manganese, phosphorus, and sulfur have bad influences upon the corrosion resistance, their respective contents should also be as low as possible.

Chromium serves to improve the pitting resistance. In order to secure the corrosion resistance of the welded joints, 19.5 to 20.5% of chromium should preferably be contained by weight.

Nickel is an essential additive element for the corrosion resistance, and a complete austenitic phase can be obtained by increasing its content. The nickel content, which is determined in consideration of the balance with the chromium content, preferably ranges from 1.75 to 18.5% by weight.

Molybdenum serves to improve the pitting resistance and crevice corrosion resistance. In order to improve the pitting resistance of the welded joints of the pipes, 6% or more of molybdenum should be contained by weight.

Nitrogen is essential to the pitting resistance and stabilization of the austenitic phase.

Copper serves to improve the acid resistance of the austenitic stainless steel which contains molybdenum. In order to secure the corrosion resistance of the welded joints, 0.5 to 1.0% of copper should preferably be contained by weight.

The following is a description of welding operation for the lines 30, 32 and 34. These pipe lines have many bent portions and branch portions each. Each branch portion of each line is formed by butt-welding a T-pipe and a straight pipe. First, the T-pipe and the straight pipe are tacked to each other, argon gas is circulated through the straight pipe, and a filler is fed for TIG arc welding.

Figure 8:
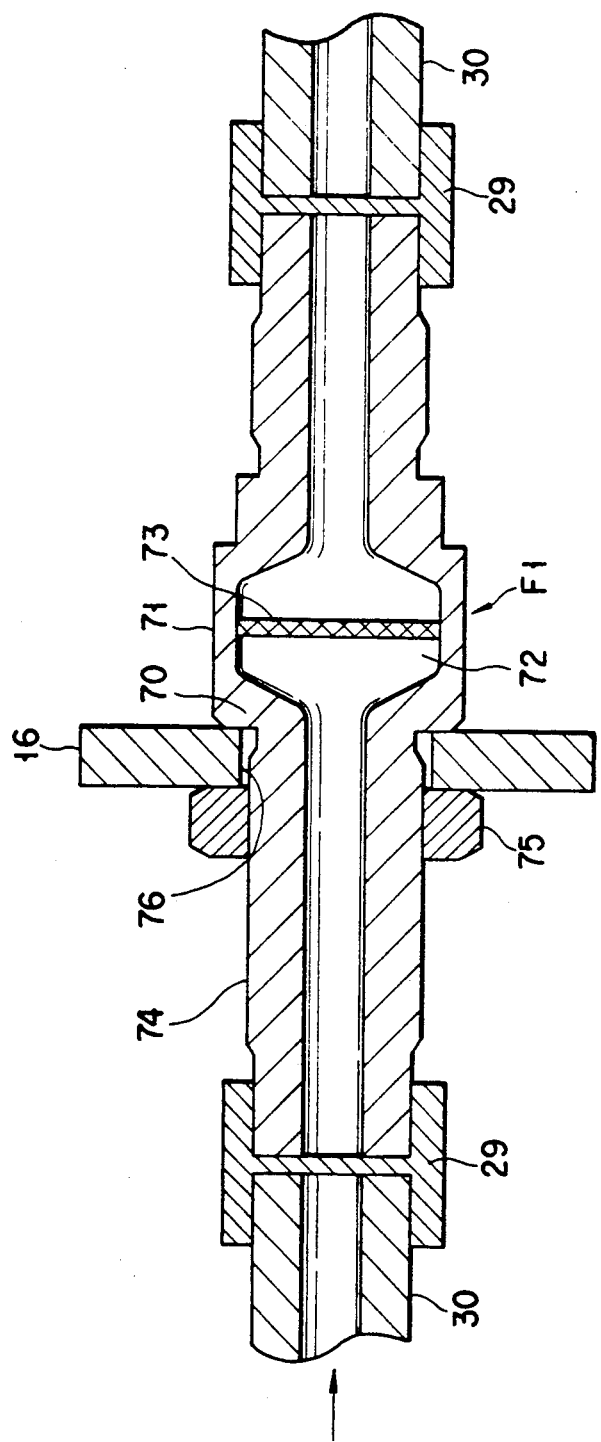
FIG. 8 is a longitudinal sectional view showing a gas filter supported on a panel.

Referring now to FIG. 8, the gas filter F1 will be described. Since the other gas filters F2 to F7 are constructed substantially in the same manner as the filter F1, a description of them will be omitted.

A body 70 of the gas filter F1 is made from the same austenitic stainless steel for the line 30. The opposite ends of the filter body 70 are removably connected to the line 30 by means of connecting members 29, individually.

A filter portion 71 is larger in diameter than any other portions of the body 70, and a filter 73 is disposed in a filter chamber 72 of this large-diameter portion 71. The filter 73, which is formed of a stainless-steel mesh, is arranged so as to block a gas passage. The filter 73 serves to trap particles in process gas.

A screw portion 74 is formed on the outer peripheral surface of that portion of the filter body 70 which extends from the inlet-side end to an end face of the large-diameter portion 71. A nut 75 is threadedly fitted on the screw portion 74.

The body 70, having the screw portion 74 thereon, is fitted in an opening 76 of the vertical panel portion 15, and is fixed to the panel portion 15 by means of a nut 76.

The following is a description of the way the CVD apparatus is operated and stopped by using the gas supply system 10 according to the first embodiment described above.

The process gas is fed into the process tube 102 via the gas filter F1 of the piping unit 25 and the like, whereby the semiconductor wafers W are subjected to CVD film formation. As this is done, vibrations caused by an air conditioner, pump, etc. in the clean room and the vacuum pump 24 in the maintenance room are propagated to the base frame 11. However, the vibration damping members 50 prevent these vibrations from being propagated to the panel 14. Thus, both horizontal and vertical vibrations in the gas supply system 10 can be restrained.

The lines 30, 32 and 34 and the gas filter F1 are resonant with the horizontal vibration. Since the vibration damping assembly 50 can restrain the horizontal vibration, however, the particles can be prevented from being released from the gas filters F1 to F7.

In order to examine the damping capability of each vibration damping assembly 50, whose horizontal and vertical low natural frequencies are 1.3 Hz and 4.5 Hz, respectively, a load of 300 kgw was applied to the assembly 50. FIGS. 9 and 10 show the results of this examination. FIG. 9 illustrates damping properties with respect to the horizontal direction, and FIG. 10 with respect to the vertical direction. In these drawings, full-line curves represent the results for the vibration damping assembly 50, and broken-line curves for a coil spring (control). As seen from both these drawings, the assembly 50 has a damping capacity greater than that of the coil spring by 10 dB or more.

The following is a description of the way the above-described gas supply system 10 is operated and stopped.

The wafer boat 103 is loaded into the process tube 102 of the CVD apparatus 100. The tube 102 is exhausted, and the semiconductor wafers W in the tube 102 are heated. Then, disilane gas and chlorine system gas are fed from the gas supply sources 22 into the process tube 102 through the lines 30, 32 and 34. In doing this, the respective pressures and flow rates of the gases are controlled by means of the pressure regulators RG1 and RG2 and the controllers MFC1 and MFC2. The centralized piping 34 and the inlet line 101 are heated to 120° C. by means of a tape heater (not shown). Preferably, the temperature to which the lines 34 and 101 are heated by means of the tape heater ranges from 70° to 150° C.

By thus feeding the disilane and chlorine system gases into the process tube 102 while heating the semiconductor wafers W under reduced pressure, the gas components are deposited on the surface of each wafer W, so that a film of a desired composition with a desired thickness is formed on the wafer surface.

The process gas supply and the heating by means of the heater are both stopped, whereupon the CVD film formation process ends. At this time, the process tube 102 continues to be exhausted. When the CVD film formation process is finished in this manner, the wafer boat 103 is unloaded from the tube 102.

While the wafer boat 103 is being unloaded, the open air gets into the process tube 102. The air is further introduced through the tube 102 into the lines 34, 32 and 30 in the order named. Water in the air reacts to the chlorine ion remaining in the lines 34, 32 and 30, thereby producing highly corrosive gas and liquid. The welded joints of the lines 34, 32 and 30 are attacked by the gas and liquid produced in this manner. Even in these highly corrosive circumstances, however, the stainless steel A can hardly be corroded. Since the stainless steel A is not liable to pitting and crevice corrosion, in particular, the welded joints of the lines 34, 32 and 30 are subject to production of neither corrosive products, naturally, nor substantial anode ions (heavy metal ions). Thus, micro-contamination can be prevented effectively, and the yield of semiconductor device products can be improved.

According to the embodiment described above, the piping unit 25 is located in the vicinity of the vacuum pump 24, so that the vibrations caused in the pump 24 can be easily propagated to the unit 25. However, most of the vibrations are absorbed by the vibration damping members 50, and hardly any vibrations can be transmitted to the piping unit 25.

Since the gas filters F1 to F7 are fixed to the panel 14 by means of their corresponding angle supports 16, moreover, they are not influenced by standing waves produced in the lines 30, and therefore, undergo no high-amplitude vibrations. Accordingly, the particles once trapped cannot be released from the mesh filters 73, so that the lines 30, 32 and 34 can be kept clean inside.

Figure 1:
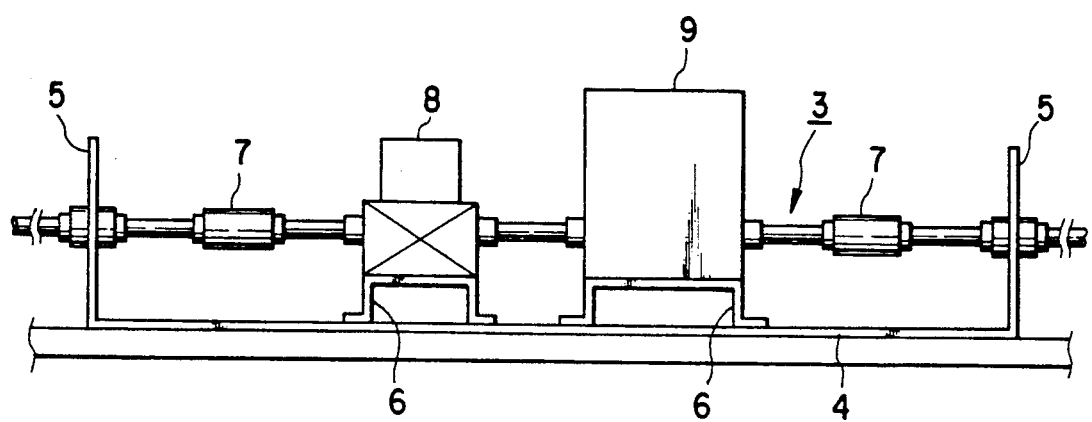
FIG. 1 is a schematic view showing part of a conventional gas supply system.

Referring now to FIG. 1, tests on corrosion inside the lines will be described.

The inventors hereof confined a chlorine gas in a the stainless steel A pipe (example 1), and examined the corrosion resistance of welded joints of the line. The chlorine gas was chosen because it is higher in corrosiveness than any other process gases. A chlorine gas containing $H_2O$ 100 ppm was confined in a pipe of the stainless steel A with an inside diameter of ¼ inch, and was left to stand for 3 days. Thereafter, the welded joints of the pipe were internally observed. Thereupon, the welded joints of pipe (example 1) were subject to no corrosion at all.

The same test was conducted on steels having the compositions shown as Controls 1 to 4 in Table 1. Thereupon, all these steel pipes exhibited slight corrosion inside the welded joints.

As seen from these test results, the stainless steel A also enjoys a high corrosion resistance at the welded joints. Thus, the stainless steel A is a suitable material for the lines of the gas supply system used in the reduced-pressure CVD apparatus. The reason is that the stainless steel A, based on the austenitic stainless steel with high corrosion resistance, contains more molybdenum, which is the most effective element for the resistance against pitting and crevice corrosion, than the steels of Controls 1 to 4.

TABLE 1

| Kind of steel | Example 1 | Control 1 | Control 2 | Control 3 | Control 4 |
|---|---|---|---|---|---|
| Elements | | | | | |
| C | 0.008 to 0.018 | ≦0.020 | 0.009 | ≦0.030 | ≦0.030 |
| Si | 0.25 to 0.55 | 0.35 to 0.73 | 0.50 | 0.28 to 0.73 | 0.30 to 0.60 |
| Mn | 0.3 to 0.8 | 1.3 to 1.7 | 1.67 | 0.95 to 1.95 | 0.70 to 1.00 |
| P | ≦0.250 | ≦0.029 | 0.022 | ≦0.35 | ≦0.030 |
| S | ≦0.003 | ≦0.010 | 0.001 | ≦0.002 | ≦0.001 |
| Cu | 0.50 to 0.90 | 0.20 to 0.50 | 0.50 | ≦0.50 | 0.20 to 0.80 |
| Ni | 17.5 to 18.5 | 13.0 to 14.5 | 13.05 | 11.05 to 14.95 | 6.50 to 7.50 |
| Cr | 19.50 to 20.50 | 16.05 to 17.00 | 17.20 | 18.05 to 19.95 | 24.50 to 26.00 |
| Mo | 6.00 to 6.50 | 2.03 to 2.30 | 2.50 | 3.03 to 3.97 | 2.80 to 3.50 |
| N | 0.18 to 0.22 | ≧0.02 | 0.0992 | | 0.11 to 0.18 |
| Mg | | | | | ≦0.015 |
| Corrosion | None | Some | Some | Some | Some |
| | | | | | (wt %) |

According to the present invention, the molybdenum content of the stainless steel A, as the material of the pipe of lines, is not limited to the value for the embodiment described above, and should preferably be 6% or more by weight. If the molybdenum content is 6% or more by weight, micro-contamination can be prevented effectively.

According to the invention, moreover, the stainless steel A is not limited for use in the gas lines and gas filters, and may be also used for valves and other piping accessories.

Available stainless steels according to the invention include partially austenitic ones, such as the ferrite-austenite two-phase stainless steel, as well as totally austenitic ones.

Furthermore, the gas supply system according to the invention is not limited to the use in the reduced-pressure CVD apparatus, and may be also used in an etching apparatus, ion implantation apparatus, plasma CVD apparatus, etc.

Figure 12:
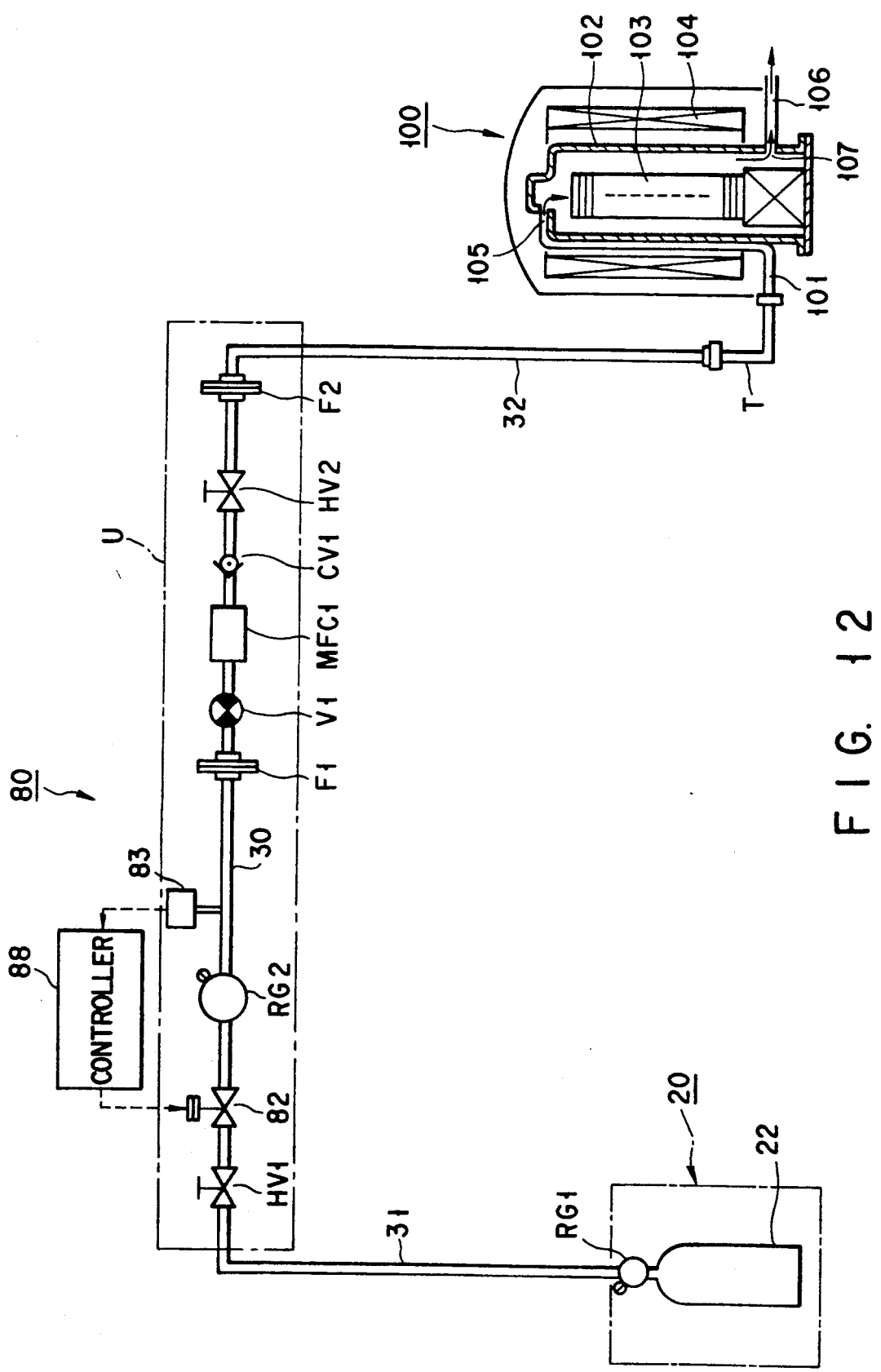
FIG. 12 is a block diagram showing the gas supply system according to the second embodiment.
Figure 13:
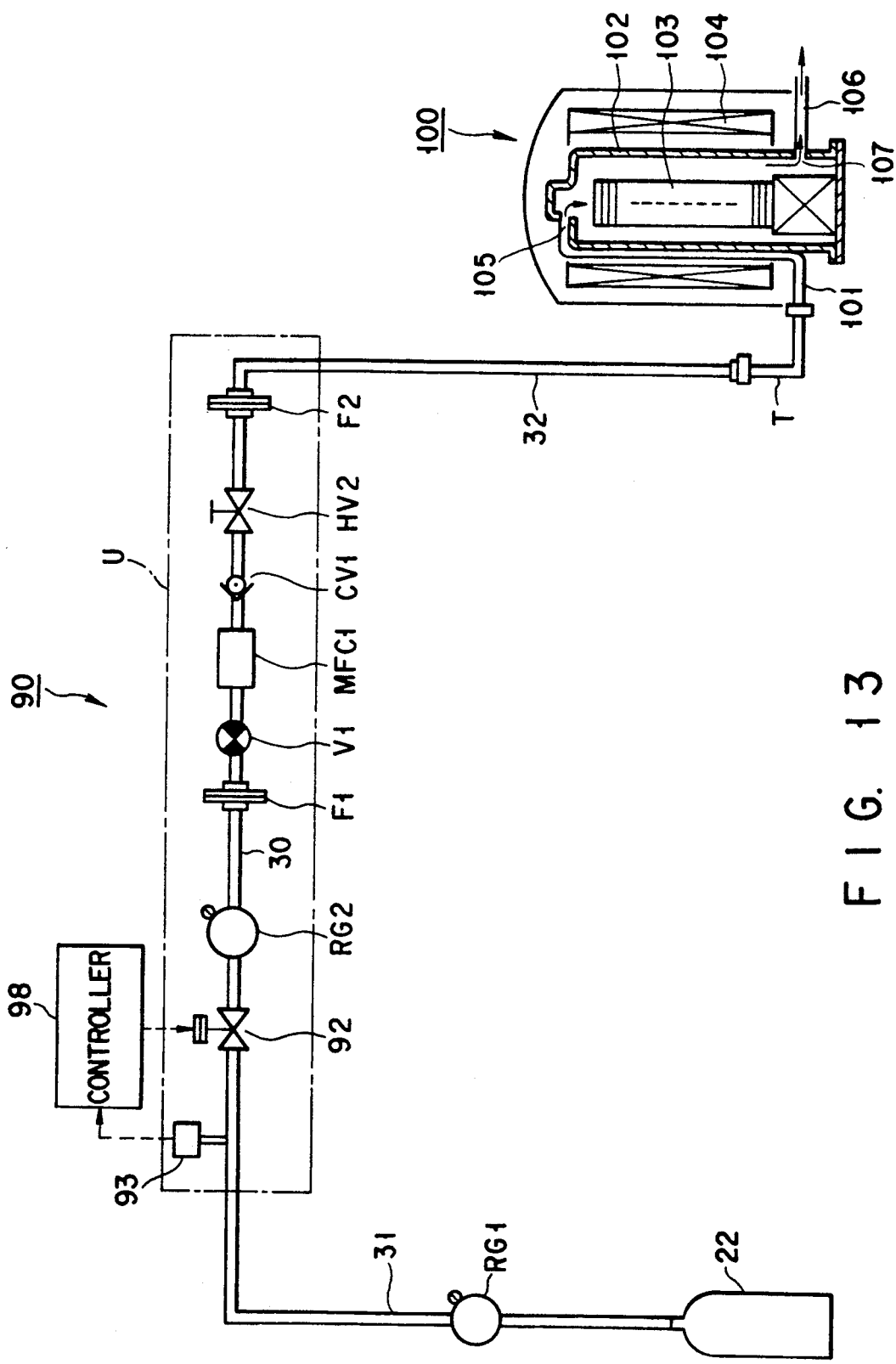
FIG. 13 is a block diagram showing a gas supply system according to a third embodiment of the invention.

Referring now to FIGS. 11 to 13, a second embodiment of the present invention will be described. A description of components or portions common to the first and second embodiments will be omitted.

A piping unit U of a gas supply system 80 includes three lines. Each pipe line is provided with an emergency shut-off valve 82 and pressure valve 83. The valve 82, the sensor 83, and a controller 88 constitutes a control loop for feedback control. More specifically, the pressure sensor 83 is connected to the input side of the controller 88, and the emergency shut-off valve 82 to the output side of the controller 88. The valve 82, which is normally open, is closed in response to a command signal from the controller 88 in case of emergency.

Gas cylinders 22 of a gas supply unit 20 communicate with the piping unit U by means of lines 31, individually. The gas cylinders 22 are loaded with process gases (including carrier gas and inert gas), such as hydrogen gas, oxygen gas, chlorine gas, nitrogen gas, etc., at a high pressure of 150 to 200 $kg/cm^2$.

A pressure regulator RG1 is connected directly to the outlet side of each gas cylinder 22. The regulator RG1 is used for primary decompression of high-pressure gas from the cylinder 22 to a pressure of 50 $kg/cm^2$.

The line 31 is provided with a hand valve HV1, the emergency shut-off valve 82, and a pressure regulator RG2, which are arranged in the order named, from the upper-course side to the lower. The regulator RG2 is used to decompress the gas at the pressure of 50 $kg/cm^2$, subjected to the primary decompression by means of the regulator RG1, to about 2 to 3 $kg/cm^2$. A detecting end of the pressure sensor 83 is attached to that portion of the line 31 which is situated just on the lower-course side of the pressure regulator RG2 for secondary decompression.

A memory of the controller 88 is previously stored with an emergency pressure. This emergency pressure is set, for example, at 5 $kg/cm^2$. When the emergency pressure is exceeded by a pressure detected by means of the sensor 83, a signal is delivered from the controller 88 to the emergency shut-off valve 82, whereupon the valve 82 is closed.

A line 30, on the lower-course side of the pressure regulator RG2, is provided with a gas filter F1, valve V1, mass-flow controller MFC1, check valve CV1, hand valve HV2, and gas filter F2. All these components used are low-pressure versions (e.g., withstanding pressure at 5 $kg/cm^2$). The components F1, V1, MFC1, CV1, HV2 and F2 are fixed to the panel of the piping unit U.

An injector 101 formed of quartz or SUS stainless steel, for example, is connected to a gas pipe line 32, on the lower-course side of the gas filter F2, by means of a Teflon tube T. The injector 101 communicates with the inside of a process tube 102.

The following is a description of the operation of the gas supply system 80 constructed in this manner.

When the temperature and pressure in the process tube 102 attain their respective process set values, signals are delivered to the gas supply unit 20, so that the outlet valve or regulator RG1 of the cylinder 22 opens. The high-pressure gas is decompressed from the pressure of 150 to 200 $kg/cm^2$ to the pressure of 50 $kg/cm^2$ by means of the regulator RG1.

The gas at the pressure of 50 $kg/cm^2$ flows into the line 31 from the gas supply unit 20, and is decompressed to 2 to 3 $kg/cm^2$ by means of the pressure regulator RG2. The process gas, subjected to the secondary decompression, passes through the various devices F1, V1, MFC1, CV1, HV2 and F2 in the piping unit U, and particles in the gas are removed. Further, the gas is fed from the injector 101 into the process tube 102 via the Teflon tube T. Then, the gas components are deposited on the surface of each wafer W in the process tube 102.

The gas pressure on the lower-course side of the pressure regulator RG2 is detected by means of the pressure sensor 83, and the detected pressure value and the emergency pressure value are compared by means of the controller 88. If the regulator RG2 goes wrong and its pressure reducing function is lowered or ruined, the pressure value detected by the pressure sensor 83 increases. If the emergency pressure value is exceeded by the detected pressure value, a close command signal is delivered from the controller 88 to the emergency shut-off valve 82, whereupon the valve 82 is closed.

According to the embodiment described above, safety measures to counter extraordinary pressure are taken for any of the pipe lines, so that the components on the lower-course side of the pressure regulators RG2 to RG7, including the gas filters, valves, mass-flow controllers, check valves, hand valves, cannot be damaged by extraordinary pressure.

According to the above embodiment, moreover, most of the components attached to the piping unit U can be reduced in size and weight. Even in the case of a complicated gas supply system including a number of lines, therefore, the piping unit U can enjoy a compact design.

As in the case of a gas supply system 90 shown in FIG. 13, feedforward control may be effected by means of a control loop which is formed of a controller 98, a pressure sensor 93, and an emergency shut-off valve 92. In this case, a detecting end of the sensor 93 is located on the upper-course side of the shut-off valve 92, and a pressure regulator RG1 for primary decompression is provided in the middle of a gas line 32.

The pressure regulator RG1 decompresses high-pressure gas from a cylinder 22 to a pressure of 4 kg/cm$^2$ at a stroke. Further, the gas pressure is reduced to 2 kg/cm$^2$ by means of a pressure regulator RG2 for secondary decompression.

In case of trouble in the pressure regulator RG1 or RG2, according to the present invention, the emergency shut-off valve 82 or 92 is actuated to prevent the high-pressure gas from flowing into the piping unit components, thereby ensuring coherent safety measures. Accordingly, small-sized, lightweight components can be used for the piping unit. Thus, the replaceability of the process gas can be improved, and the whole gas supply system can be made compact.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A gas supply system comprising:
   a gas source for supplying a process gas to a reduced-pressure vessel;
   a piping unit including a metallic pipe arranged between said gas source and said reduced-pressure vessel through which said process gas circulates; and
   a conduit, at least a part of which is composed of a metal, arranged between said piping unit and said reduced-pressure vessel, wherein a part of said conduit which is composed of a metal comprises an austenitic stainless steel containing 6% or more of molybdenum by weight.

2. A gas supply system according to claim 1, wherein a part of said conduit that is composed of a metal comprises an austenitic stainless steel containing 6.0 to 6.5% of molybdenum by weight.

3. A gas supply system according to claim 1, wherein a part of said conduit that is composed of a metal comprises an austenitic stainless steel containing 6.0 to 6.5% of molybdenum, 17.5 to 18.5% of nickel, and 19.5 to 20.5% of chromium, all by weight, and further comprising at least copper and nitrogen.

4. A gas supply system according to claim 1, wherein said piping unit further includes filter means for seizing particles contained in said process gas, said filter means being fixed to a panel of said piping unit.

5. A gas supply system according to claim 1, wherein said piping unit further includes vibration damping means for damping vibrations propagated to a part of said conduit that is composed of a metal.

6. A gas supply system according to claim 1, wherein at least part of an inner surface of a part of said conduit that is composed of a metal is exposed to ambient air when said process gas is not circulated therein.

7. A gas supply system according to claim 1, wherein a part of said conduit composed of a metal comprises a welded joint.

8. A gas supply system according to claim 1, further comprising vacuum pump means which operates i conjunction with said piping unit for exhausting said reduced-pressure vessel.

9. A gas supply system according to claim 1, wherein said reduced-pressure vessel comprises a process tube which is heated by heater means of a heating oven.

10. A gas supply system according to claim 9, wherein said conduit is wound with a tape heater which heats said process gas.

* * * * *

UNITED STATES PATENT AND TRADEMARK OFFICE
CERTIFICATE OF CORRECTION

PATENT NO. : 5,307,568
DATED : May 3, 1994
INVENTOR(S) : Takenobu MATSUO, et al.

It is certified that error appears in the above-indentified patent and that said Letters Patent is hereby corrected as shown below:

On the title page, Item [75], the 3rd inventor's first name should read as follows:

--Shuji--

Signed and Sealed this

Ninth Day of August, 1994

Attest:

BRUCE LEHMAN

Attesting Officer

Commissioner of Patents and Trademarks